United States Patent
Kishkovich et al.

(10) Patent No.: US 6,620,630 B2
(45) Date of Patent: Sep. 16, 2003

(54) SYSTEM AND METHOD FOR DETERMINING AND CONTROLLING CONTAMINATION

(75) Inventors: Oleg P. Kishkovich, Greenville, RI (US); Anatoly Grayfer, Newton, MA (US); William M. Goodwin, Medway, MA (US); Devon Kinkead, Holliston, MA (US)

(73) Assignee: Extraction Systems, Inc., Franklin, MA (US)

(*) Notice: Subject to any disclaimer, the term of this patent is extended or adjusted under 35 U.S.C. 154(b) by 0 days.

(21) Appl. No.: 09/961,802

(22) Filed: Sep. 24, 2001

(65) Prior Publication Data

US 2003/0068834 A1 Apr. 10, 2003

(51) Int. Cl.[7] ............................................. H01L 21/00
(52) U.S. Cl. ........................................ 438/7; 356/237.4
(58) Field of Search ..................... 357/237; 356/237, 356/237.4; 166/250.01; 96/117; 359/29; 438/7

(56) References Cited

U.S. PATENT DOCUMENTS

| | | | |
|---|---|---|---|
| 3,834,122 A | 9/1974 | Allison et al. | ............ 55/33 |
| 4,170,901 A | 10/1979 | Conkle et al. | ......... 73/421.5 |
| 4,429,736 A | 2/1984 | Turner | ................. 165/61 |
| 4,645,516 A | 2/1987 | Doshi | ................... 55/16 |
| 4,998,433 A | 3/1991 | Stumpf et al. | ......... 73/25.01 |
| 5,122,355 A | 6/1992 | Prasad et al. | .......... 423/351 |
| 5,274,434 A | * 12/1993 | Morioka | .............. 356/237 |
| 5,574,230 A | 11/1996 | Baugh | ............... 73/863.23 |
| 5,773,713 A | 6/1998 | Barber et al. | .......... 73/61.41 |
| 5,856,198 A | 1/1999 | Joffe et al. | ............. 436/100 |
| 5,983,704 A | 11/1999 | Park et al. | ............. 73/28.01 |
| 6,096,267 A | 8/2000 | Kishkovich et al. | ....... 422/52 |
| 6,287,023 B1 | 9/2001 | Yaegashi et al. | ......... 396/565 |
| 6,290,779 B1 | 9/2001 | Saleh et al. | ................. 134/2 |

FOREIGN PATENT DOCUMENTS

| | | |
|---|---|---|
| DE | 198 47 697 | 4/2000 |
| DK | 198 41 814 | 3/2000 |
| EP | 0 298 000 | 4/1989 |
| EP | 0 692 297 | 1/1996 |
| EP | 1 166 845 | 6/2001 |
| EP | 1 190 945 | 3/2002 |
| JP | 11-20034 | 1/1999 |
| JP | 11-57346 | 3/1999 |
| JP | 11-64316 | 3/1999 |

* cited by examiner

*Primary Examiner*—John F. Niebling
*Assistant Examiner*—Andre C Stevenson
(74) *Attorney, Agent, or Firm*—Bowditch & Dewey, LLP (57) ABSTRACT

A system and method for determining and removing contamination recognizes the need to determine contamination caused by a plurality of contaminants which includes refractory compounds, high molecular weight compounds and low molecular compounds operating at different rates. The system in accordance with a preferred embodiment of the present invention includes a collection device that emulates the environment of the surfaces of certain optical elements. The method for determining and preferably removing contamination includes maintaining an extended duration sampling time to enable the collection of a desirable mass of high molecular weight compounds. In a preferred embodiment, the collection device is operated past a breakthrough capacity to quantitatively measure high molecular weight compounds and other contaminants.

21 Claims, 8 Drawing Sheets

SYSTEM AND METHOD FOR DETERMINING AND CONTROLLING CONTAMINATION

BACKGROUND OF THE INVENTION

Semiconductor manufacturers continue to measure and control the level of contamination in the processing environment, especially during the critical steps of the photolithography processes. The typical means of determining the quality and quantity of contamination in gas samples in cleanroom manufacturing environments involves sampling air and purge gases, such as, for example, filtered and unfiltered air, clean dry air, and nitrogen, with sampling tubes or traps, typically containing an adsorptive medium such as, the polymer Tenax®. This sampling process is followed by analysis using thermal desorption, gas chromatography and mass spectrometry (TD/GC/MS). The combination of TD/GC/MS provides identification of sample components and a determination of the concentration of these components. The most abundant contaminants in these manufacturing environments are low molecular weight components such as acetone and isopropyl alcohol. The current sampling time for existing traps typically varies between 0.5 and 6 hours with total accumulated sample volumes ranging typically between 20 and 50 liters.

Further, in applications that are directed to the manufacturing of or use of optical elements such as, for example, photolithography, the detection and quantification of compounds having a higher molecular weight such as, for example, siloxanes is of primary concern. These compounds having a higher molecular weight are however, typically in much lower concentrations as compared with the low molecular weight species. Further, the compounds having a high molecular weight can also be defined as condensable compounds with a boiling point typically greater than approximately 150° C. The current methods for determining contamination has the limitation of the sample volume being based on the total trap capacity of the lighter or lower molecular weight components, for example, compounds having typically less than six carbon atoms. As the heavier components are usually present at much lower concentrations, the collection of a significant mass of these higher molecular weight species is limited.

In addition, polluting or contaminating substances may adhere onto the optical elements and reduce the transmission of light. Currently airborne contamination is addressed in cleanroom environments with little regard for contaminants that may be adsorbed onto the surfaces of optical elements. The adsorbed contamination reduces the transmission of light through the optical elements and system.

Thus contamination of optical systems is emerging as a significant risk to photolithography as shorter wavelengths of the electromagnetic spectrum are exploited. However, molecular films on optical surfaces physically absorb and scatter incoming light. Scattered or absorbed light in photolithography optical surfaces causes distortion of the spherical quality of wavefronts. When the information contained in the spherical wavefront is distorted, the resulting image is also misformed or abberated. Image distortions, or in the case of photolithography, the inability to accurately reproduce the circuit pattern on the reticle, cause a loss of critical dimension control and process yield.

A need still exists for determining, accurately and efficiently, the presence and quantity of contaminants that can alter and degrade the optical systems in semiconductor processing instruments.

SUMMARY OF THE INVENTION

The system of the present invention provides an accurate and efficient system of determining and/or controlling the quality and/or quantity of contamination within a gas sample which can reduce the performance of optical elements used in semiconductor processing instruments, such as, for example, within the light path of a deep ultraviolet photolithography exposure tool. In a preferred embodiment of the present invention, the contamination may be gaseous as well as contamination adsorbed onto optical surfaces. Optical performance can be evaluated without limitation as the level of transmitted or reflected light through an optical system. The system and method of the present invention are predicated on the recognition that compounds having both high and low molecular weights can contribute to the contamination of optical systems but can operate at different rates. As such, the contaminants that negatively impact the performance of optical elements can be described in terms of different order, such as, for example, first, second and third order effects.

First and second order contaminating effects have a greater impact on contamination of optical systems than third or fourth order contaminants. The first order contaminants may comprise high molecular weight organics such as, for example, $C_6$ siloxanes and $C_6$ iodates with an inorganic component which is not volatilized through combination with oxygen. Second order contaminants may comprise high molecular weight organics, such as, for example, compounds including carbon atoms within the range of approximately six to thirty carbon atoms ($C_6$–$C_{30}$). Third order effects can arise due to the contaminating effects of organics such as $C_3$–$C_6$ that have approximately three to six carbon atoms. Further, fourth order contaminants include organics such as, for example, methane, that have approximately one to five carbon atoms. In many applications, the first and second order contamination can have a much lower concentration than the third and/or fourth order contamination, yet have a significantly greater effect on the operation of the system.

A preferred embodiment in accordance with the present invention of a method for detecting and monitoring, and preferably removing contamination in a semiconductor processing system includes delivering a gas sample from the processing system to a collection device. The method further includes collecting contamination which comprises refractory compounds, and high and low molecular weight compounds, from the gas in the collection device by sampling the gas for a duration exceeding the saturation capacity of the collection device for high molecular weight compounds. The compounds having a high molecular weight are condensable with a boiling point typically greater than approximately 150° C.

A preferred embodiment of the system and method of the present invention for determining contamination includes the detection of refractory compounds such as, for example, siloxanes, silanes and iodates, and high molecular weight organics. The preferred embodiment includes the removal of refractory compounds, high molecular weight organics and low molecular weight organics, all of which contribute to the contamination of optical systems, but which can operate at different contamination rates.

The system of the present invention for determining contamination can use different types of sample collecting media. In a preferred embodiment, the sample collecting media can emulate the environment of the optical surfaces of interest such as, for example, the absorptive or reactive properties of the optical surfaces. A measure of contamination adsorbed onto optical surfaces enables the minimization and preferably the removal of the contaminants. In another preferred embodiment, a polymer that has a high capacity for absorbing the compounds with a high boiling point is used in a collection device such as, for example, Tenax® a polymer based on 2-6 diphenyl p-phenylene. The operation of the system in accordance with a preferred embodiment of the present invention includes quantitatively measuring the concentration of both low and high boiling point compounds in the same sample wherein the collection device has been driven beyond the breakthrough volume or saturation capacity of the collection media to capture the low molecular weight compounds. The breakthrough volume of the collection device is defined in a preferred embodiment as the quantity of gas needed to go beyond the adsorption capacity of the device.

In accordance with a preferred embodiment of the present invention, the method for detecting contamination includes a sampling time extended by, for example, a number of hours, days or weeks to enable collection of an appropriate mass of contaminants which are present in relatively low concentration. In a preferred embodiment, the sampling time is typically beyond the breakthrough capacity of the collection device for low molecular weight components and is at least six hours long and preferably within a range of six to twenty-four hours for a sampling tube system. The extended time allows for the collection of higher masses of refractory compounds and higher molecular weight compounds that may interfere with the performance of optical components even more than low molecular weight compounds. The higher molecular weight compounds include, but are not limited to, for example, siloxanes and silanes.

In accordance with another preferred embodiment of the present invention, a semiconductor processing instrument, for example, a photolithography cluster, includes a filtering system to remove contaminants. The filtering system includes a selective membrane to filter organic compounds from a gas stream.

The foregoing and other features and advantages of the system and method for determining and controlling contamination will be apparent from the following more particular description of preferred embodiments of the system and method as illustrated in the accompanying drawings in which like reference characters refer to the same parts throughout the different views.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

Preferred embodiments of the present invention are described with reference to the following drawings, wherein.

DETAILED DESCRIPTION OF THE INVENTION

The present invention is directed to a system and method for determining and controlling contamination. Preferred embodiments of the present invention address gaseous contamination as well as the contaminants adsorbed on surfaces, for example, an optical surface. The latter is more critical to the performance of the optical elements.

Table 1 illustrates an abundance of various species in a cleanroom environment, such as, for example, a fabrication environment using photolithography systems. The low molecular weight species such as acetone, isopropyl alcohol and low molecular weight siloxanes are the most prevalent in manufacturing environments. Compounds that are most likely to reduce the performance of optics are compounds having a high contamination coefficient or a high molecular weight, for example, can include but are not limited to, methoxytrimethyl silane, trimethyl silane and trimethyl silanol. These compounds appear in italics in Table 1 have a higher molecular weight, higher contamination coefficient and an inorganic component. Compounds that negatively impact optical systems may also be described and include refractory compounds such as silanes, siloxanes and iodates, in particular hexamethyldisiloxane ($C_6$-siloxane).

TABLE 1

| Compound (in cleanrooms) | Typical concentration, ppbV |
|---|---|
| Isopropyl Alcohol | 610.0 |
| Acetone | 330.0 |
| Ethanol | 134.0 |
| Silane, Methoxytrimethyl- | 35.0 |
| Heptane, Hexadecafluoro- | 28.0 |
| 2-Pentanone | 17.0 |
| 2-Butanone(MEK) | 9.8 |
| Hexane, Tetradecafluoro- | 8.9 |
| Butanoic Acid, Heptafluoro- | 5.2 |
| Tetrahydrofuran | 3.3 |
| 3-Buten-2-one | 2.5 |
| 4-Methyl-2-pentanone(MIBK) | 1.9 |
| Silane, Trimethyl(1-Methylethoxy)- | 1.7 |
| n-Pentane | 1.4 |
| Silanol, Trimethyl- | 1.4 |

Optics design also affects the relative sensitivity of the system to contamination. For example, light transmission is important in transmissive optical systems, like windshields, wherein reflectance approaches zero. High reflectivity systems, where transmission approaches zero, are inherently twice as contamination sensitive as transmissive optical systems because photons pass through any contaminating film twice, whereas light energy is only absorbed or scattered once in transmissive systems.

Describing the effect of molecular films on optical surface properties in terms of mathematics yields equation 1, for reflectance, and equation 2 for transmission.

$$\rho x(\lambda) = \rho(\lambda)\exp[-2\alpha c(\lambda)x] \quad \text{Equation 1}$$

$$\tau x(\lambda) = \tau(\lambda)\exp[-\alpha c(\lambda)x] \quad \text{Equation 2}$$

Where:
- $\rho$ = reflectance
- $\alpha$ = absorbance
- $\tau$ = transmittance
- $\lambda$ = wavelength
- $\alpha c$ = absorbance of a contaminating film, empirically determined Both transmitted and reflected energy, which is information used in lithography instruments and tools in semiconductor fabrication systems, drop exponentially with the accumulation of molecular films on optical surfaces. In lithography processes, the first order effect of molecular films on lenses is typically a reduction in light intensity due to energy absorbance by the contaminating film. These transmission losses reduce the number of wafers processed per hour, and consequently reduce productivity. This is analogous to the power reductions in spacecraft solar arrays, caused by accumulating molecular films. Secondary effects, in lithography processes, involve a reduction in image uniformity, which reduces critical dimension uniformity and yield.

Photochemical decomposition reactions occur when high-energy photons interact with organic vapors. These reactions form extremely reactive free radicals from otherwise neutral and relatively inert organic molecules. Irrespective of where radical formation occurs, in the gas phase or on the surface of optical elements, the resulting free radicals may react to form much larger organic compounds, which can contaminate optical elements. In severe cases, a polymer layer may be formed on the optical surface. The relationship between the chemical nature of the organic species and wavelength of light it absorbs can affect the nature and severity of optics contamination. For example, I-line or 365 nm wavelength light is energetic enough to break down only a few iodated components, which are not commonly found in clean room air. 248 nm wavelength light, typically used in deep ultraviolet (DUV) lithography for fabricating 250 to 150 nm linewidth devices, is more efficient and reacts with most halogenated organics and may even interact with some common hydrocarbons. 193 nm light, required for less than 130 nm geometries, reacts very efficiently with a wide range of airborne or gaseous molecular organic contaminants. 157 nm optical elements are even more sensitive to environmental conditions than 193 nm optics because this wavelength of light is efficiently absorbed or interacts with nearly all organic species plus oxygen and atmospheric moisture, requiring the exposure area, the area between the final optical element and the wafer, commonly called the free working area, to be purged with an inert, clean, dry, oxygen-free gas.

As the wavelength of light used in the lithography exposure tool decreases, the energy per unit photon increases. These progressively higher energy photons stand a better chance of breaking the bonds of a number of commonly present molecular species, ultimately rendering them into reactive species that stick to optical surfaces. The overall structure of a molecule plays a significant role in the ability of a photon to break any specific bond. Table 2 summarizes optics contamination as the lower wavelengths of electromagnetic spectrum are used to provide for the fabrication of smaller features.

Atmospheric pressure, low K1 factor optical lithography for less than 150 nm critical dimension on 300 mm wafer substrate device production may be the basis of advanced Integrated Circuit (IC) production in the near term. In these technology nodes, lithography-induced critical dimension variations have a particularly acute affect on device characteristics. For example, the standard deviation of propagation delay times for CMOS based ring-oscillators increases from 1% for 300 nm devices to 20% in 250 nm devices. Variations in gate oxide, impurity, and gate lengths were the primary causes of variations in device delay times. Below 200 nm gate length, however, the impact of gate length variation accounts for a remarkable 80% of the effect. The criticality of dimension variation in 150 nm lithography, for example, has lead to a critical dimension control budget of 15 nm, post-etch, 3 sigma. Since exposure dose and image resolution are compromised by optics contamination in proportion to the location and thickness of the contaminating film, contamination needs to be prevented before it occurs.

TABLE 2

| Issue | $\lambda = 248$ nm | $\lambda = 193$ nm | $\lambda = 157$ nm | Comments |
|---|---|---|---|---|
| Propensity to form photo-deposits in nitrogen (<10 ppb O2) | Low | Moderate | Nearly certain | Assumes organic vapor concentrations in the low ppb range |
| Ability to photoclean optics surfaces in-situ using active oxygen | Low | Moderate | High | Based on oxygen absorption coefficients and organic layer absorbance |
| Interactions with hydrocarbons | Aromatics only, moderate absorbance | Aromatics absorb very strongly, others weakly | Nearly all hydrocarbons absorb | Interaction determines allowable levels of contamination before lens performance suffers |

Existing methods of contamination control in lithography involves the use of activated carbon filters and/or some combination of adsorptive and chemisorptive media to adsorb or chemisorb the contaminants in air and gas streams that come in contact with the lens surfaces. In some cases, periodic regeneration of the adsorptive beds by thermal desorption occurs. Passive adsorption is unable to practically capture and retain the lighter hydrocarbons, oxygen, and water that interfere with imaging using 193 nm and 157 nm light. The propensity to form photodeposits, ability to photoclean, and interaction of hydrocarbons is tabulated relative to different wavelengths of light in Table 2.

Figure 1:
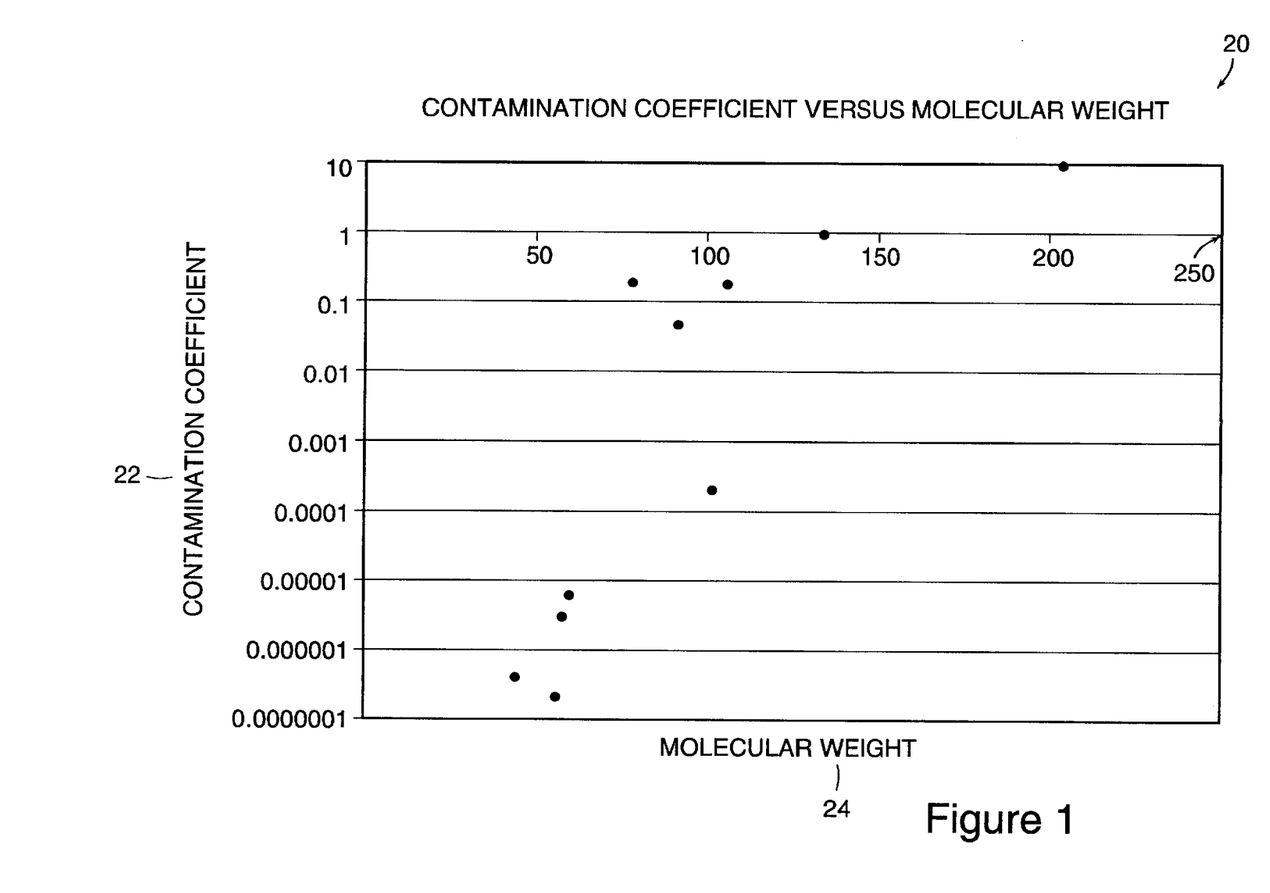
FIG. 1 is a graphical representation of contamination coefficient versus molecular weight.

FIG. 1 is a graphical representation 20 of molecular weight 24 versus a contamination coefficient 22. Note that a higher contamination coefficient means that it is more likely to contaminate system optics. The nearer term 193 nm wavelengths show some correlation between the contaminant's molecular weight and its ability to contaminate the lens. Consequently, while the higher molecular weight species are of greater immediate concern for lens contamination, the lower boiling point materials, which are typically in higher concentration in semiconductor cleanrooms as shown in Table 1, can become a concern due to their much higher concentration and ability to adsorb photon energy at progressively shorter wavelengths. Moreover, particularly at 157 nm, oxygen and water need to be removed from the light path because they also absorb photon energy.

Existing systems have many disadvantages including passive adsorption systems that do not effectively remove low molecular weight organic materials; the removal efficiency and capacity of passive adsorption systems are proportional to the concentration of the impurities. In this application, the inlet concentrations are very low, making efficiency and capacity correspondingly low; and on-site regeneration of passive adsorption beds requires periodic temperature increases to regenerate the beds. Since most advanced lithography systems must maintain air and gas temperature stability at typically less than 100 milliKelvin, to avoid heating or cooling the optics, which change their optical characteristics, this strategy is impractical in advanced lithography.

Figure 2:
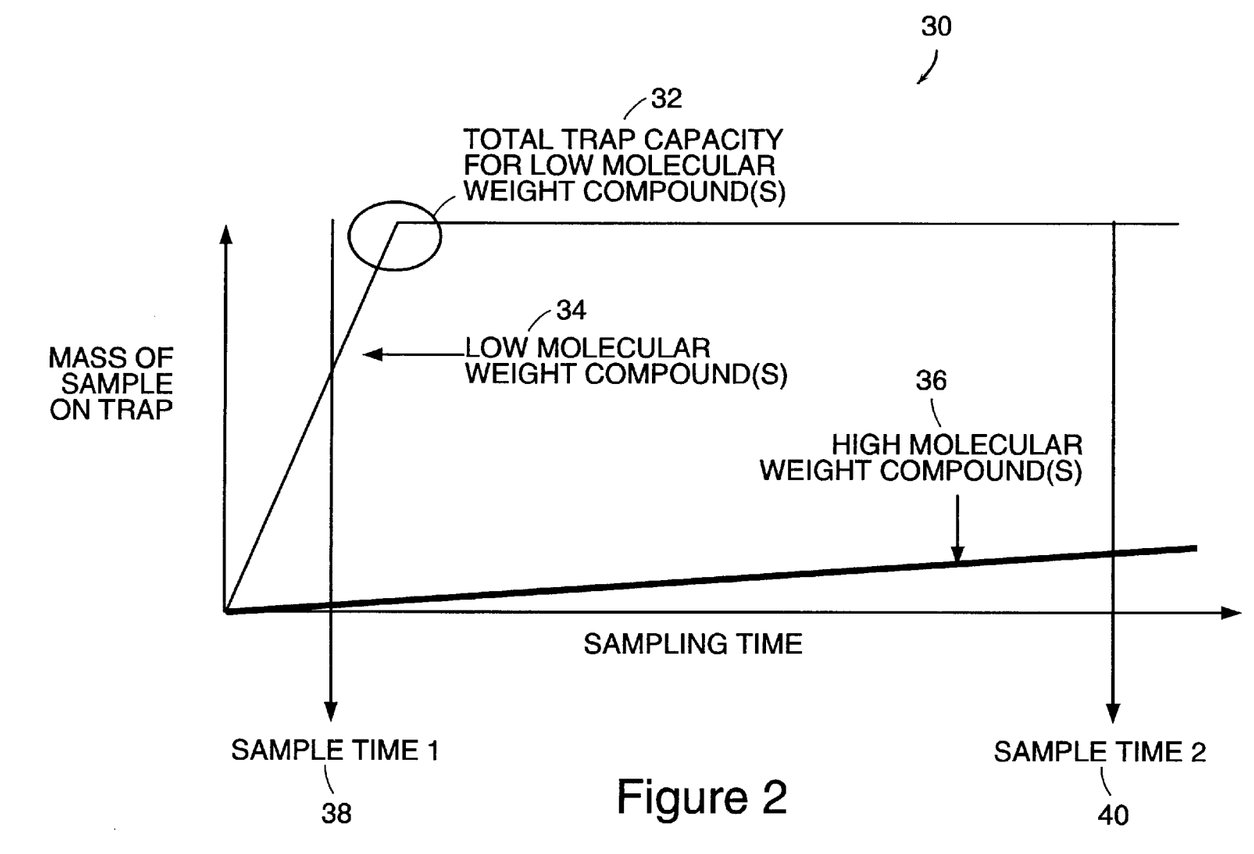
FIG. 2 is a graphical representation illustrating a comparison of a preferred embodiment of the system for determining contamination with respect to sample mass in a trap and sampling time in accordance with the present invention and the prior art.

FIG. 2 is a graphical representation 30 illustrating a comparison of a preferred embodiment of the system for determining contamination with respect to sample mass in a collection device or contamination trap and sampling time in accordance with the present invention and the prior art. An extended duration sample time, sample time 40, is used wherein the gas sample volume is not limited by the low molecular weight breakthrough volume, as is the case with the prior art method using sample time 38. In a preferred embodiment, the sampling time is at least six hours long and is preferably in a range of six hours to twenty-four hours. Higher capacity traps yielding longer collection times may be necessary for certain applications.

The extended time sampling method in accordance with a preferred embodiment of the present invention, collects higher masses of higher molecular weight compounds, which contribute to the contamination in the gas supply and which reduce the performance of optical elements more so than lower molecular weight compounds. Both high and low molecular weight compounds contribute to the contamination level but are operative at different rates. The high molecular weight compounds contribute to first order contaminating effects as they cause more damage to the optical systems even if present at low concentrations than low molecular weight compounds which contribute to third and fourth order effects. The collection device in accordance with a preferred embodiment is driven beyond saturation or breakthrough capacity to quantitatively measure the equilibrium concentration of low molecular weight compounds. The breakthrough volume is the amount of gas sample volume required to go beyond the absorbent capacity of the collection device. It should be noted that contaminates may be inorganic materials which may be carried by organics to the optical element. This extended time sampling method can also use different types of sample collecting media including those with adsorptive properties close to that of the optical surfaces of interest.

A preferred embodiment of the present invention includes "glass" or "coated glass" based adsorptive contamination traps. These contamination traps have not been used in the past due to their limited ability to collect and retain lower molecular weight species. These materials have surface properties identical or similar to properties of the optical elements used in the optical systems of photolithography tools. Other materials that emulate the surface properties of these optical elements that generate contamination can also be used.

In a preferred embodiment, the extended time sampling method may be extended from a few hours to several days and even weeks. The amounts of analyte collected represents the average value over time for compounds that have not reached their breakthrough time as illustrated by line 36 at sample time 2, line 40 and an average equilibrium concentration for those species that have already reached their breakthrough volume as illustrated by line 34 at sample time 2, line 40.

With respect to higher molecular weight species, the internal surface of the sampling lines and/or manifolds are kept at equilibrium with the gas phase sample, and therefore do not interfere with the sample collection process. In a preferred embodiment, between sampling sessions, flow through the sampling lines and/or manifolds is maintained.

Figure 3:
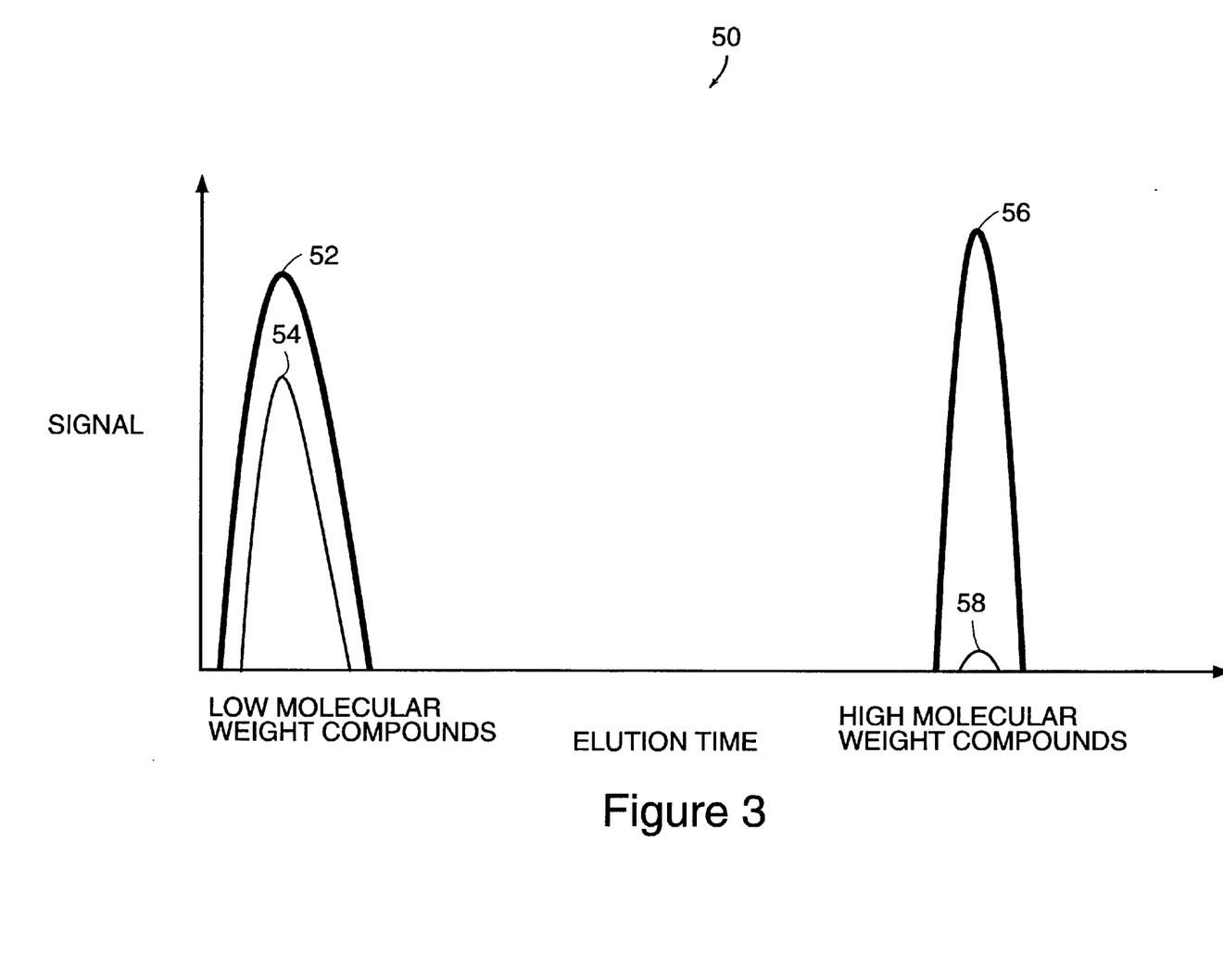
FIG. 3 is a graphical representation illustrating analysis spectral comparisons of the system and method of determining contamination in accordance with a preferred embodiment of the present invention and the prior art.

FIG. 3 is a graphical representation 50 illustrating spectral analysis comparisons of the system and method of determining contamination in accordance with a preferred embodiment of the present invention and the prior art. The extended time sampling method of the present invention offers better sensitivity for components having high boiling points as illustrated by lines 52, 56. The results of the extended time sampling method in accordance with a preferred embodiment of the present invention, better represent contamination on the optical surface, given the improved high molecular weight sample collection method of the present invention. A preferred embodiment of the system of the present invention provides the ability to use the actual optical surface of interest as the collection medium which in turn allows alignment of sampling surface properties and optical surface properties thereby making the analysis results more meaningful to the prediction of optics contamination.

The extended time sampling method in accordance with a preferred embodiment may reduce and preferably eliminate the uncertainties of sample loss on sample lines and/or manifolds. The extended time sampling method's simplicity minimizes the effect of uncontrolled contamination by personnel deploying the traps. Consequently, less training and experience are required to collect samples.

Figure 4:
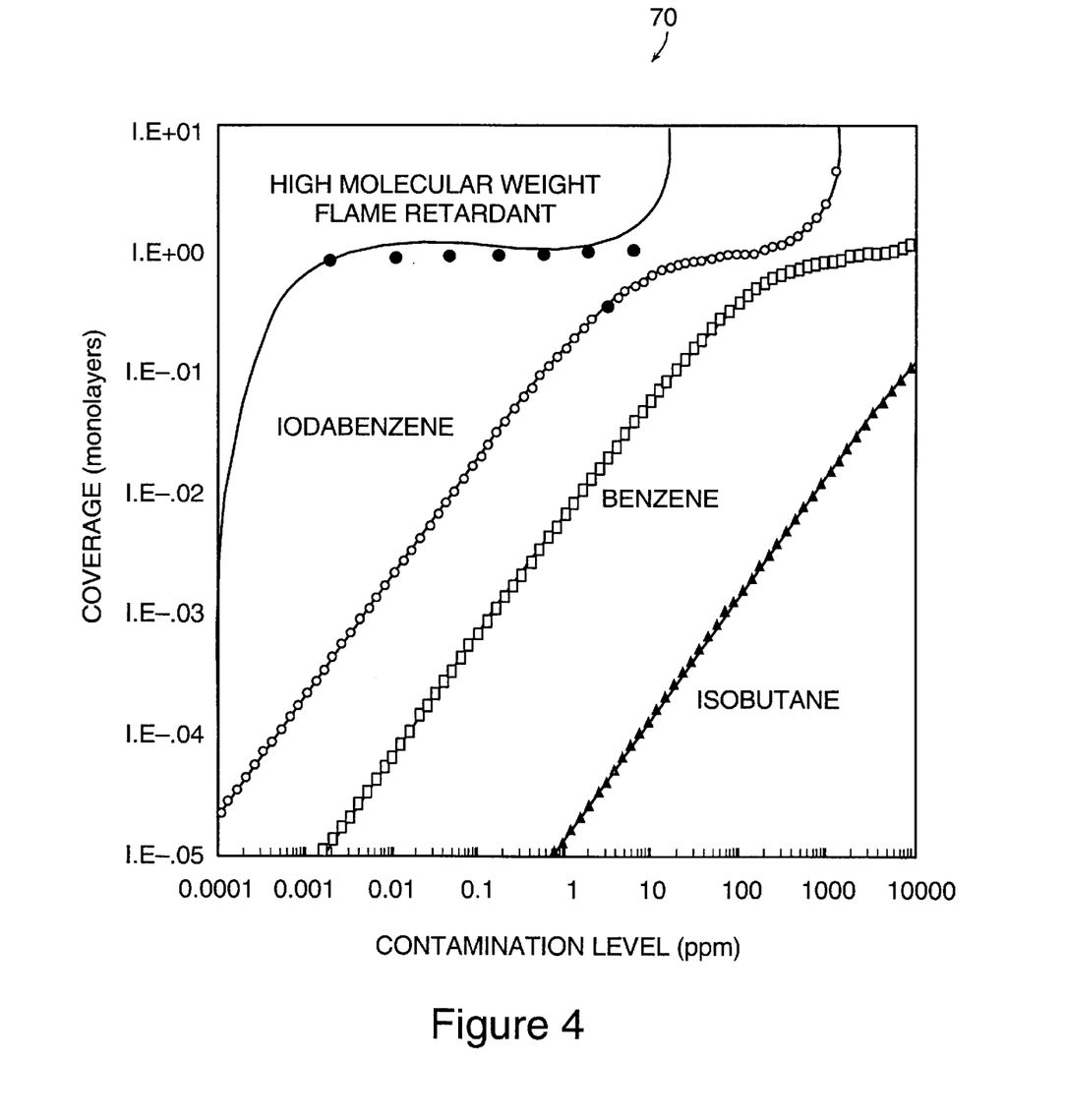
FIG. 4 is a graphical representation illustrating surface coverage as a function of contamination level in accordance with a preferred embodiment of the present invention.

FIG. 4 illustrates graphically surface coverage as a function of contamination level showing greater surface mass coverage per unit concentration in accordance with a preferred embodiment of the present invention. FIG. 4 illustrates this relationship for higher molecular weight components at the upper left with the lower molecular components towards the lower right of the graph. For a given concentration, the higher molecular weight compounds collect on surfaces more readily than do lower molecular weight species. One of the problems with the prior art method is that due to the shorter sampling times, much of what little sample is available for collection collects on the sample tube walls and manifold surfaces, all upstream of the collection trap, and never reaches the trap. This phenomenon causes a further loss of high molecular weight sample mass. Moreover, heated sampling lines and/or manifolds, which could ameliorate the problem, are not practical in the production cleanroom environment.

Figure 5:
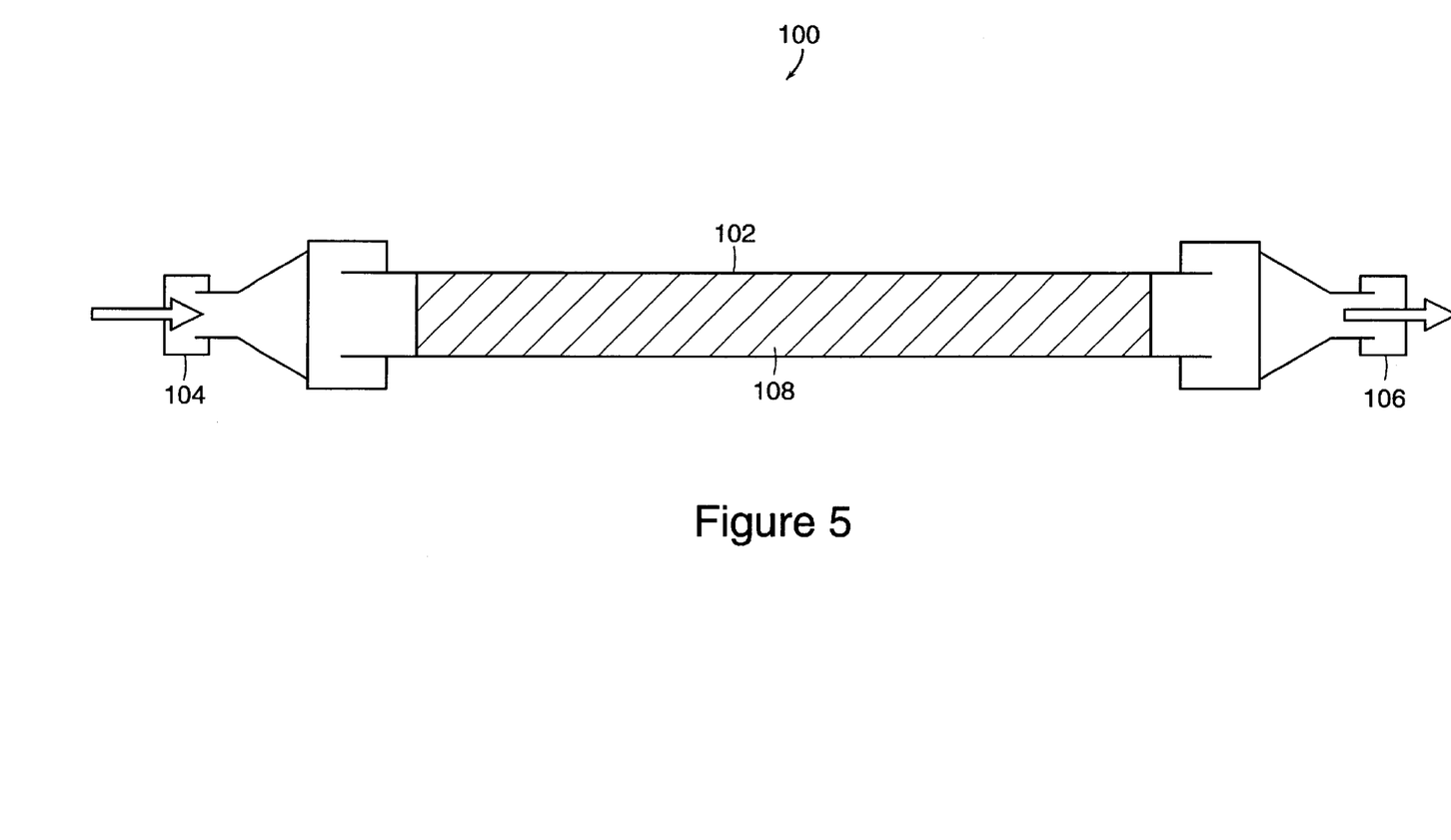
FIG. 5 is a preferred embodiment of a system of determining contamination in accordance with the present invention.

FIG. 5 is a diagram of a preferred embodiment of a system 100 for determining contamination in accordance with the present invention. The preferred embodiment of the apparatus includes a tubular collection device 102 having an inlet port 104 and an outlet port 106. In a preferred embodiment, the collection device includes, absorptive materials 108 such as, for example, glass spheres of a given size. In a preferred embodiment, crushed glass spheres are used. In another preferred embodiment, the absorptive material 108 is the polymer Tenax® supplied by, for example, Supelco. Tenax® has a high capacity for high boiling point compounds and operating Tenax® past low molecular weight breakthrough capacity allows the capture of a meaningful and analyzable mass of high molecular weight compounds. To collect a sample, an end cap in the inlet post is removed, allowing gas from a gas source to pass through the inlet port 104. Laser light may be directed through the sampling tube in a preferred embodiment of the present invention. The free radicals of the contaminants present in the gas sample may bond with the absorptive media 108 in the collection device 102.

In a preferred embodiment of the system for controlling contamination, multiple sample tubes and blank collection devices may be used. The collection device or refractory trap is applicable to both high pressure sampling, for example, purge gas, venting to the atmosphere assuming sufficient pressure and filter sampling, wherein the traps are connected to a vacuum source. The flow is controlled by an easily changeable critical orifice.

In a preferred embodiment, the trap contains three sample tubes, one blank and two active sample devices. Chemical analysis of the data may be correlated to transmission or image uniformity loss of the lithography tool, for example, using a regression analysis which weights first, second, third and fourth order effects:

$$\text{Uniformity or Intensity} = a[C_6\text{-siloxane}] + b[C_6-C_{30}] + c[C_3-C_6] + d[C_1-C_5]$$

therein the parenthetic expressions are indicative of the concentration of species. First and second order contaminating effects have a greater impact on contamination of optical systems than third or fourth order contaminants and typically show a greater contamination coefficient (e.g. a>b>c>d). The first order contaminants may comprise high molecular weight refractory organics such as, for example, $C_6$ siloxanes and $C_6$ iodide with an inorganic component which is not volatilized through combination with oxygen. Second order contaminants may comprise high molecular weight organics, such as, for example, compounds including carbon atoms within the range of approximately six to thirty carbon atoms ($C_6-C_{30}$). Third order effects can arise due to the contaminating effects of organics such as $C_3-C_6$ that have approximately three to six carbon atoms. Further, fourth order contaminants include organics such as, for example, methane, that have approximately one to five carbon atoms.

Figure 6:
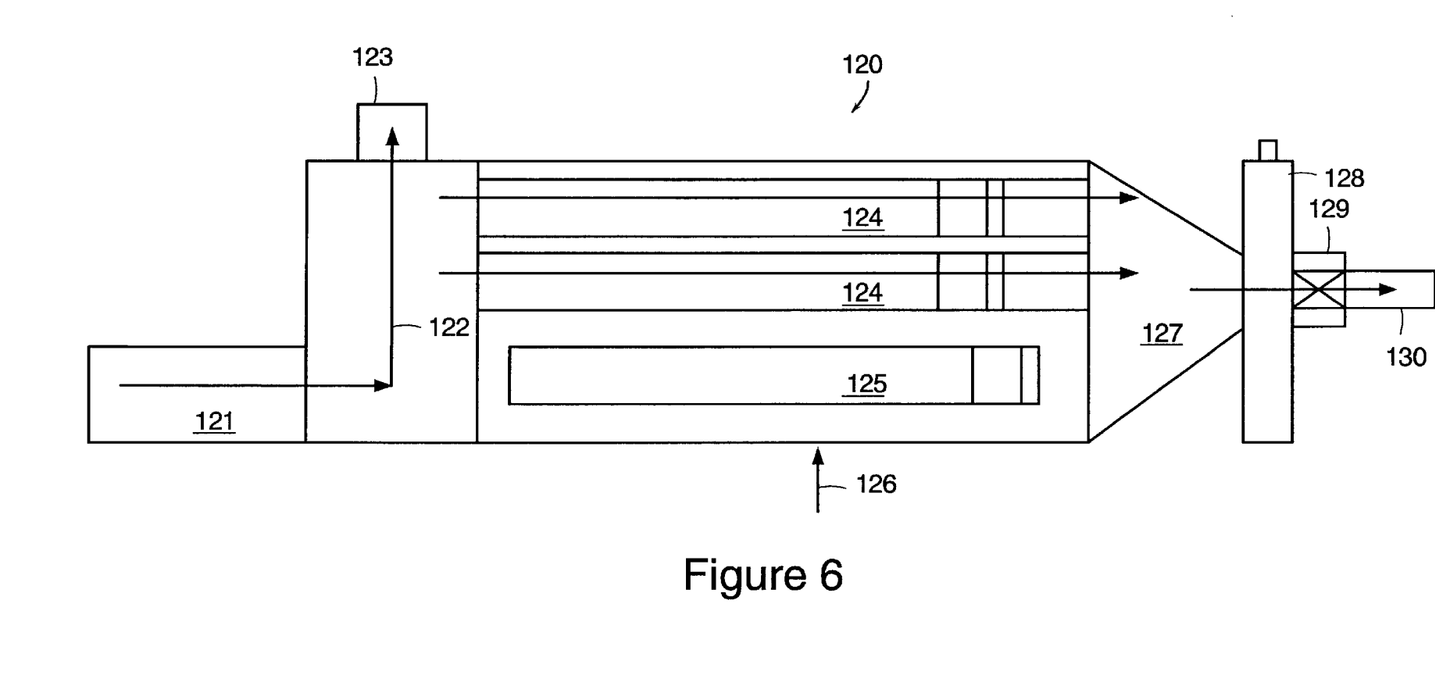
FIG. 6 is a preferred embodiment of a refractory trap system in accordance with the present invention.

In preferred embodiments of the system in accordance with the present invention, a refractory trap may be used both upstream and downstream of any in-line filtration system. FIG. 6 is a preferred embodiment of a refractory trap system 120 in accordance with the present invention. As described herein before refractory compounds include at least siloxanes such as, for example, hexamethyldisiloxane ($C_6$), silanes such as, for example, $C_3$-silane, silanols such as, for example, $C_3$ and iodates. The refractory trap system 120 includes a conduit 121 in communication with a gas source and through which a gas sample is carried with pressures ranging between approximately 1 to 120 psi. The gas sample is carried downstream to a pressure cavity 122. A pressure relief valve 123 allows the continuous flow of gas to ensure that the pressure cavity walls are in equilibrium with the gas phase of the gas sample. The refractory trap system 120 includes active sampling traps or collection devices 124 and a blank trap 125 in the trap cavity 126. The active sampling trap elements 124 may include an absorptive medium such as, for example, the polymer Tenax®. The gas sample flow in active elements is approximately 0.11 lpm. The blank trap 125 is not in communication with the gas source or pressure cavity and as such is not removing any contaminants. The outflow gas stream from the active collection devices 124 flows downstream into a manifold 127 which is in fluid communication with a vacuum line 130, via an orifice 129. A pressure/vacuum regulator valve 108 is disposed between the manifold and the orifice 129 to regulate pressure. The refractory trap system 120 provides for both a low pressure application or a high pressure application using a single design.

In a preferred embodiment, the gas supply may include a particular constituent such as hydrogen gas which may be used to clean the surfaces of the collection devices or, surfaces of optical systems that have been contaminated by a surface contaminant, for example, SiX. The gas additive combines with the surface contaminant to form a volatile compound that is then purged from the system. For example, SiX combines with hydrogen gas to form silane ($SiH_4$) which is volatile and is purged. The purge gas, is preferably in the ultra high purity gas level allowing the collection device to be placed upstream and downstream of the typical in-line filters.

A sample report derived from a collection device may comprise the following information:

Contact information: Name, address, phone, email of person sending the sample
Tool #:
Gas sampled: N2 Air
Sample location:
   Upstream of filter
   Downstream of filter
   Interstack
Sample start date:
Sample end date:
Date received:
Report date:
Upstream Sample
C2-C5: X ppb* (*equilibrium concentration)
C6-C30: Y ppb
Total siloxanes: z ppb
Total sulfur compounds:
Past history on this sample location:

In another preferred embodiment the collection device is located directly in contact with the airstream, thereby avoiding sample line contamination and using either passive diffusion or an active flow to collect the sample.

Figure 7:
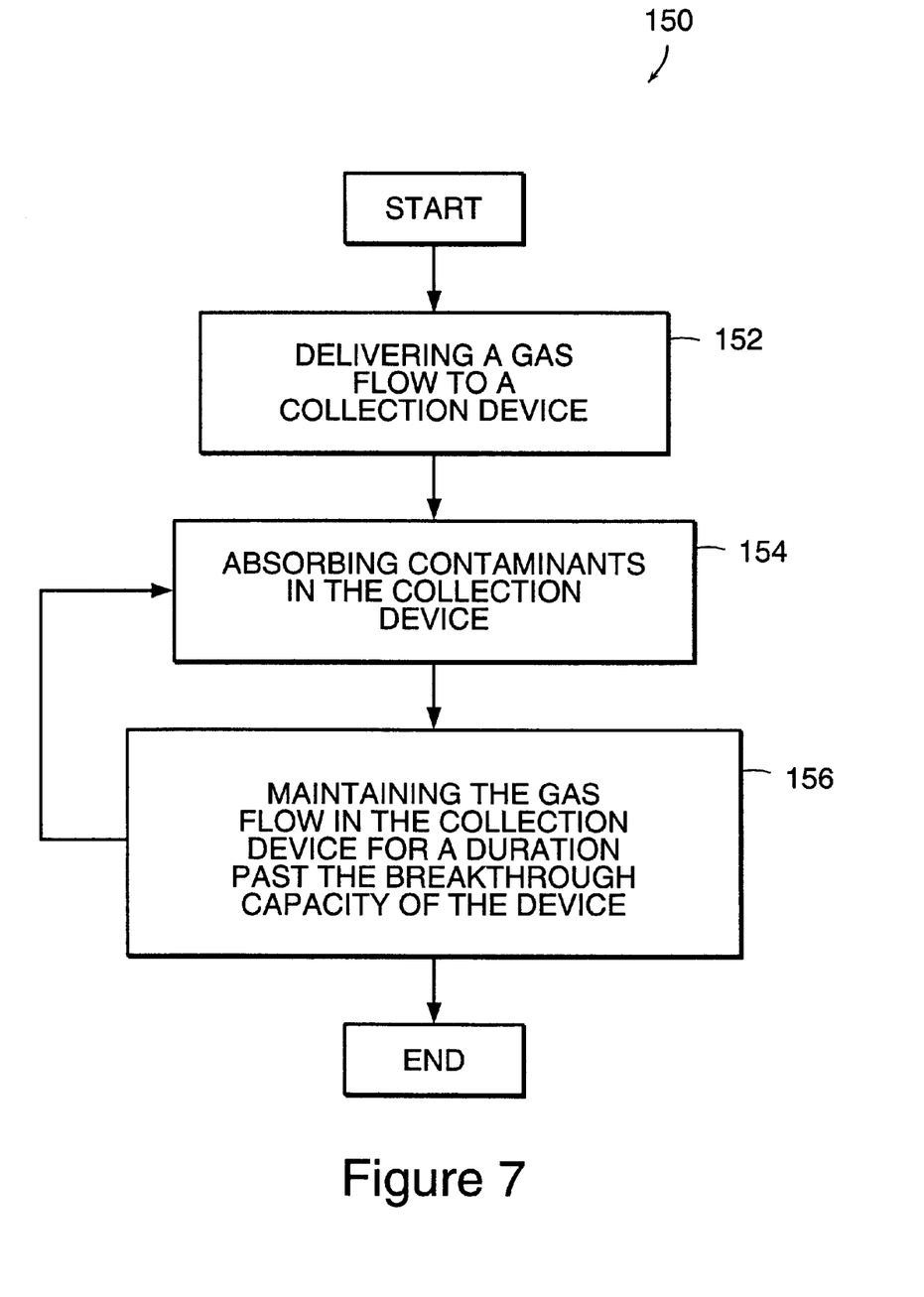
FIG. 7 shows a flow chart of the method of detecting contamination in accordance with a preferred embodiment of the present invention.

FIG. 7 is a flow chart of the method 150 of detecting and removing contamination in accordance with a preferred embodiment of the present invention. The method includes the step 152 of delivering a gas sample to a collection device. In a preferred embodiment, the collection device is as described with respect to FIG. 5 and/or FIG. 6. The method further includes the step 154 of absorbing contaminants contained in the gas sample in the collection device. The collection device is configured to emulate the environment of surfaces of optical elements. The method 150 includes the step 156 of maintaining the gas sample in the collection device for an extended duration sampling time which represents operation of the collection device past the saturation or breakthrough capacity of the device, for at least the lower molecular weight species. As described herein before the extended duration sampling time enables the collection of an equilibrium concentration of low and preferably high molecular weight compounds.

The internal surfaces of the sampling lines and manifolds are in equilibrium with the gas phase sample in order to not interfere with the sample collection process. In a preferred embodiment, the method 150 includes maintaining the flow of the gas sample through the sampling lines and manifolds.

In accordance with another preferred embodiment, the system of the present invention comprises a photolithography cluster tool, for example, an exposure tool, used in manufacturing semiconductor devices, that is sensitive to molecular contamination and a filtering system which removes the molecular contamination which may include volatile and semi-volatile or condensable organic substances, causing contamination of optical elements via series of homogeneous and/or heterogeneous ultraviolet (UV) induced processes. These optical elements are contained typically within a light path of a photolithography tool.

In accordance with a preferred embodiment of the present invention, the filtering system for the ultra-purification of compressed fluids, for example, nitrogen, air or other suitable gases for purging of optical elements, with organic constituents comprises a membrane module, which separates the components of a given gas mixture by means of their different transport rates through the membrane.

High removal efficiency of organic contaminants, in particular of first and second order contaminants may be obtained due to selective permeation on glassy polymers such as, for example, polyetherimide or rubbery polymers such as, for example, silicone rubber and also on porous ceramic membranes which generally have extended temperature limits up to approximately 300° C. Water and oxygen are preferably also removed using the membrane as they can degrade light transmission along the optical path in the system.

Membranes are generally available in two morphologies: homogeneous or composite. In the latter, thin polymeric permselective "skin" is deposited on a preformed porous substrate, which need not be the same polymer and may or may not interact with permeate. Polymeric membranes may be cast into various shapes: flat sheets for plate and frame and spiral wound modules, in the latter sheets and separating screens are wound into sandwich like structure by rolling around central permeate tube and self-supporting fibers, for example, hollow fibers and capillary membranes.

Figure 8:
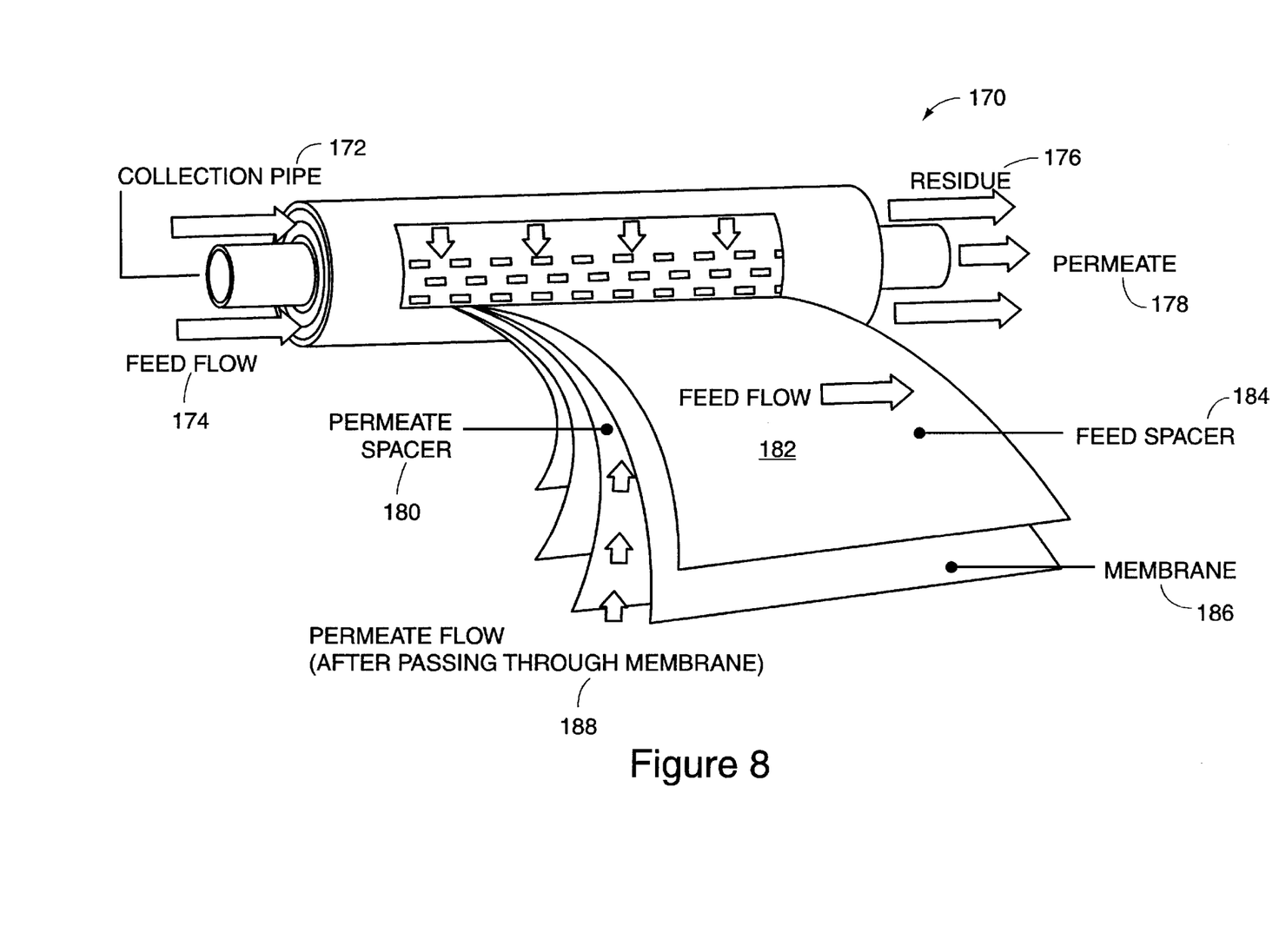
FIG. 8 is a diagram illustrating a preferred embodiment of a filtering system in accordance with the present invention.

In a preferred embodiment as illustrated in FIG. 8 the filtering system 170 comprises a filtration module based on a selectively permeable membrane 186 to filter organic compounds from a gas stream such as, for example, a nitrogen stream. The selectively permeable membrane may be of the type such as supplied by, for example, Membrane Technology & Research, Inc. In this preferred embodiment, the feed flow 174 is nitrogen that contains some amount of organic contamination. The feed flow may comprise 99–100% nitrogen with any balance in organic contaminants as well as water and oxygen. Assuming 90% removal efficiency of the membrane, the composition of the residue is purified by a factor of 10. The composition of the permeate stream can be enriched with organic contaminants. The filtering system 170, in accordance with a preferred embodiment of the present invention preferably removes contamination effects of first through fourth order contributors.

In another preferred embodiment the filtering system 170 comprises a filtration module based on a selective membrane 186 to filter organic compounds from a gas stream 174 wherein the collection device or pipe 172 is connected to a vacuum source to increase the pressure gradient across the membrane 186 to increase membrane efficiency. In this embodiment the feed flow 174 is nitrogen that contains some amount of organic contamination. In a particular embodiment the feed flow, 174 can include nitrogen with organic contaminants as indicated above. Assuming a 99% removal efficiency of the membrane, the composition of the residue 176 is again improved by a factor of 10 for nitrogen and the balance in organic contaminants. The composition of the permeate stream 178 is further enriched with organic contaminants.

In another preferred embodiment, the filtering system 170 comprises a filtration module based on a selective membrane 186 to filter organic compounds from a gas stream. In this particular embodiment the feed flow is nitrogen that contains some amount of organic contamination. The feed flow 174 comprises 99–100% nitrogen with the balance being organic contaminants. Assuming 90% removal efficiency of the membrane, the composition of the residue 176 is 99–100% nitrogen and the balance in organic contaminants. The composition of the permeate stream 178 may be enriched with organic contaminants. The organic contaminant enriched airstream 178 is then directed to a regenerative adsorption device for purification. The permeate stream 178, which has been purified by an adsorption bed system, is then returned to the feed flow. This filtering system in accordance with a preferred embodiment of the present invention reduces the loss of feed flow volume.

In another preferred embodiment, the filtration module consists of a composite membrane, a support of which is pretreated with a solid electrolyte washcoat and an oxide catalyst to promote electrochemical decomposition of the permeate 178 within the support at relatively low temperature.

In another preferred embodiment, the filtering system 170 comprises a filtration module based on a selective membrane 182 to filter organic compounds from a gas stream. In this embodiment, the feed flow 174 is nitrogen that contains some amount of organic contamination. The feed flow comprises 99–100% nitrogen with the balance being organic contaminants, oxygen, and water. Assuming 90% removal efficiency of the membrane, the composition of the residue is again improved by a factor of 10 for nitrogen with the balance being organic contaminants, but the membrane may not be selective enough to remove oxygen and water. Accordingly, the residue 176 of the filter system 170 is then directed to a second filter system, of similar mechanical construction to the first, which contains a different membrane specifically selected to allow oxygen and water to traverse the membrane, but is, again, less permeable to nitrogen. The residue of this second filter system may now be substantially free of organics, water, and oxygen which are all hazards to advanced lithography processes. Again, the composition of the permeate stream may be enriched with organic contaminants, water, and oxygen.

This filtering system can be used to purify nitrogen, synthetic air, clean dry air, all gas streams used in advanced photolithography, or any other compressed gas used in semiconductor processing. It may be, however, advantageous to filter synthetic air prior to mixing, for example, filter oxygen and nitrogen separately, before mixing them together to make synthetic air.

The filtering system may be constructed without limitation in a number of ways such as, for example, rolled-up supported membrane, rolled up self-supporting membrane, membrane disposed on a prefabricated porous supporting structure, a cylindrical pleated air filter, or comprise hollow fiber bundles through which the feed flow is directed.

The preferred embodiments of the filter system of the present invention remove both high and low molecular weight organic compounds and other unwanted contaminants such as water vapor, oxygen, inorganic impurities, effectively, and with a low concentration feed flow. In addition, the filter systems of the present invention operate continuously without filter replacement or pressure, flow, or temperature change or disruption. The preferred embodiments of the present invention address the problems of the prior art filters which have a limited capacity for low molecular weight hydrocarbons and rely on regenerative thermal cycles, which cause instability of the output gas temperature. The preferred embodiments of the filtering systems of the present invention provide an unlimited capacity for removing low molecular weight hydrocarbons and other contaminating species, independent of feed flow concentration, produce no sudden changes in the output flow conditions, and are easy and inexpensive to maintain.

It should be understood that the programs, processes, methods and systems described herein are not related or limited to any particular type of collection media, or computer or network system (hardware or software), unless indicated otherwise. Various types of general purpose or specialized computer systems may be used with or perform operations in accordance with the teachings described herein.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams. While various elements of the preferred embodiments have been described as being implemented in software, other embodiments in hardware or firmware implementations may alternatively be used, and vice-versa.

It will be apparent to those of ordinary skill in the art that methods involved in the system and method for determining and controlling contamination may be embodied in a computer program product that includes a computer usable medium. For example, such a computer usable medium can include a readable memory device, such as, a hard drive device, a CD-ROM, a DVD-ROM, or a computer diskette, having computer readable program code segments stored thereon. The computer readable medium can also include a communications or transmission medium, such as, a bus or a communications link, either optical, wired, or wireless having program code segments carried thereon as digital or analog data signals.

The claims should not be read as limited to the described order or elements unless stated to that effect. Therefore, all embodiments that come within the scope and spirit of the following claims and equivalents thereto are claimed as the invention.

What is claimed:

1. A method for detecting and monitoring contamination in a semiconductor processing system, comprising the steps of:
    delivering a gas sample from the semiconductor processing system to a collection device having a saturation capacity, the processing system including an optical system of a photolithography tool; and
    collecting contamination from the gas in the collection device for a sampling duration representative of a sample volume that exceeds the saturation capacity of the collection device to measure contamination of the optical system.

2. The method of claim 1, wherein the sampling duration is at least six hours.

3. The method of claim 1, wherein the sampling duration enables the collection of a sufficient and analyzable mass of compounds having a high molecular weight and a boiling point greater than approximately 150° C.

4. The method of claim 1, wherein the step of collecting contamination includes collecting refractory compounds, high molecular weight compounds and low molecular weight compounds.

5. The method of claim 1, further comprising providing a collection device including glass spheres having predetermined surface properties.

6. The method of claim 1, further comprising providing a collection device that is tubular.

7. The method of claim 1, further comprising providing an adsorptive material including the polymer Tenax®.

8. The method of claim 1, further comprising measuring the contamination including at least one of refractory compounds, high molecular weight compounds and low molecular weight compounds.

9. The method of claim 1, further comprising the steps of:
    delivering a gas stream from the photolithography tool to the collection device;
    detecting contaminants from the gas stream with the collection device;
    analyzing contaminants; and
    actuating a membrane to remove contaminants from the optical path.

10. The method of claim 1 further comprising providing at least one collection device having a selectively permeable membrane that filters contaminants such as at least one of a refractory compound, a high molecular weight compound and a low molecular weight compound from the gas flow.

11. The method of claim 10, further comprising coupling the collection device to a vacuum source to increase a pressure gradient across the selective membrane.

12. The method of claim 1, further comprising collecting the gas sample from a gas flow that comprises clean dry air, nitrogen, and/or other inert gases.

13. The method of claim 10, further comprising a regenerative adsorption device in fluid communication with an output permeate stream from the selectively permeable membrane.

14. The method of claim 10, further comprising providing a second collection device in fluid communication with a residue stream of the collection device, the second collection device having a second membrane that is selectively permeable to oxygen and water.

15. The method of claim 1, further comprising the steps of:
    delivering a gas stream to a contaminated surface in the processing system in the presence of light, the gas stream having an additive gas and the gas stream combining with a contaminant on the contaminated surface to form a volatile product; and
    removing the volatile product from the processing system.

16. The method of claim 15, wherein the step of removing the volatile product includes using a purge gas.

17. The method of claim 15, wherein the contaminated surface is a surface of the optical system.

18. A method for monitoring contamination in a photolithography system having an optical system, comprising the steps of:
    delivering a gas stream from the photolithography stream to a collection device having a saturation capacity, the collection device including an absorptive material; and collecting contamination including one of at least refractory compounds, high molecular weight compounds and low molecular weight compounds from the gas stream in the collection device for a sampling duration representative of a sample volume that exceeds the saturation capacity of the collection device to measure contamination of the optical system.

19. The methods of claim 18, wherein the sampling duration enables the collection of a sufficient and analyzable mass of compounds having a high molecular weight and a boiling point greater than approximately 150° C.

20. The method of claim 18, wherein the absorptive material includes the polymer Tenax®.

21. The method of claim 18, wherein the collection device includes glass spheres having predetermined surface properties.

* * * * *